United States Patent
Agache et al.

(10) Patent No.: US 10,112,827 B2
(45) Date of Patent: Oct. 30, 2018

(54) PROCESS FOR PRODUCING AN ELECTROMECHANICAL DEVICE

(71) Applicant: Commissariat a l'energie atomique et aux energies alternatives, Paris (FR)

(72) Inventors: Vincent Agache, Monestier de Clermont (FR); Francois Baleras, Saint Georges de Commiers (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/825,818

(22) Filed: Nov. 29, 2017

(65) Prior Publication Data
US 2018/0148328 A1    May 31, 2018

(30) Foreign Application Priority Data
Nov. 30, 2016   (FR) ...................................... 16 61722

(51) Int. Cl.
*B81C 1/00* (2006.01)
*B81B 3/00* (2006.01)

(52) U.S. Cl.
CPC ...... *B81C 1/00476* (2013.01); *B81C 1/00944* (2013.01); *B81C 1/00952* (2013.01);
(Continued)

(58) Field of Classification Search
CPC .................. B81C 2201/0109; B81C 2201/053
See application file for complete search history.

(56) References Cited

U.S. PATENT DOCUMENTS

2011/0140216 A1* 6/2011 Qu ...................... B81C 1/00952
257/419
2016/0318753 A1* 11/2016 Chou ..................... B81B 3/001

FOREIGN PATENT DOCUMENTS

DE     100 02 363 A1    8/2001

OTHER PUBLICATIONS

French Preliminary Search Report dated Jul. 6, 2017 in French Application 16 61722, filed on Nov. 30, 2016 (with English Translation of Categories of cited documents and Written Opinion).

* cited by examiner

*Primary Examiner* — Mounir Amer
(74) *Attorney, Agent, or Firm* — Oblon, McClelland, Maier & Neustadt, L.L.P.

(57) ABSTRACT

The invention is a process for producing an electromechanical device including a movable portion that is able to deform with respect to a fixed portion. The process implements steps based on fabrication microtechnologies, applied to a substrate including an upper layer, an intermediate layer and a lower layer. These steps are:

a) forming first apertures in the upper layer;
b) forming an empty cavity in the intermediate layer, which step is referred to as a pre-release step because a central portion of the upper layer lying between the first apertures is pre-released;
c) applying what is called a blocking layer to the upper layer, this layer covering the first apertures, the blocking layer and the central portion together forming a suspended microstructure above the empty cavity;
d) producing a boundary trench in the suspended microstructure, so as to form, in this microstructure, a mov-
(Continued)

able portion and a fixed portion, the movable portion forming a movable member of the electromechanical device.

18 Claims, 13 Drawing Sheets

(52) U.S. Cl.
CPC ..... *B81B 3/0021* (2013.01); *B81B 2201/0214* (2013.01); *B81B 2201/0264* (2013.01); *B81B 2203/0118* (2013.01); *B81C 2201/0109* (2013.01); *B81C 2201/019* (2013.01); *B81C 2201/0132* (2013.01); *B81C 2201/0176* (2013.01); *B81C 2201/0178* (2013.01); *B81C 2201/0181* (2013.01); *B81C 2201/053* (2013.01)

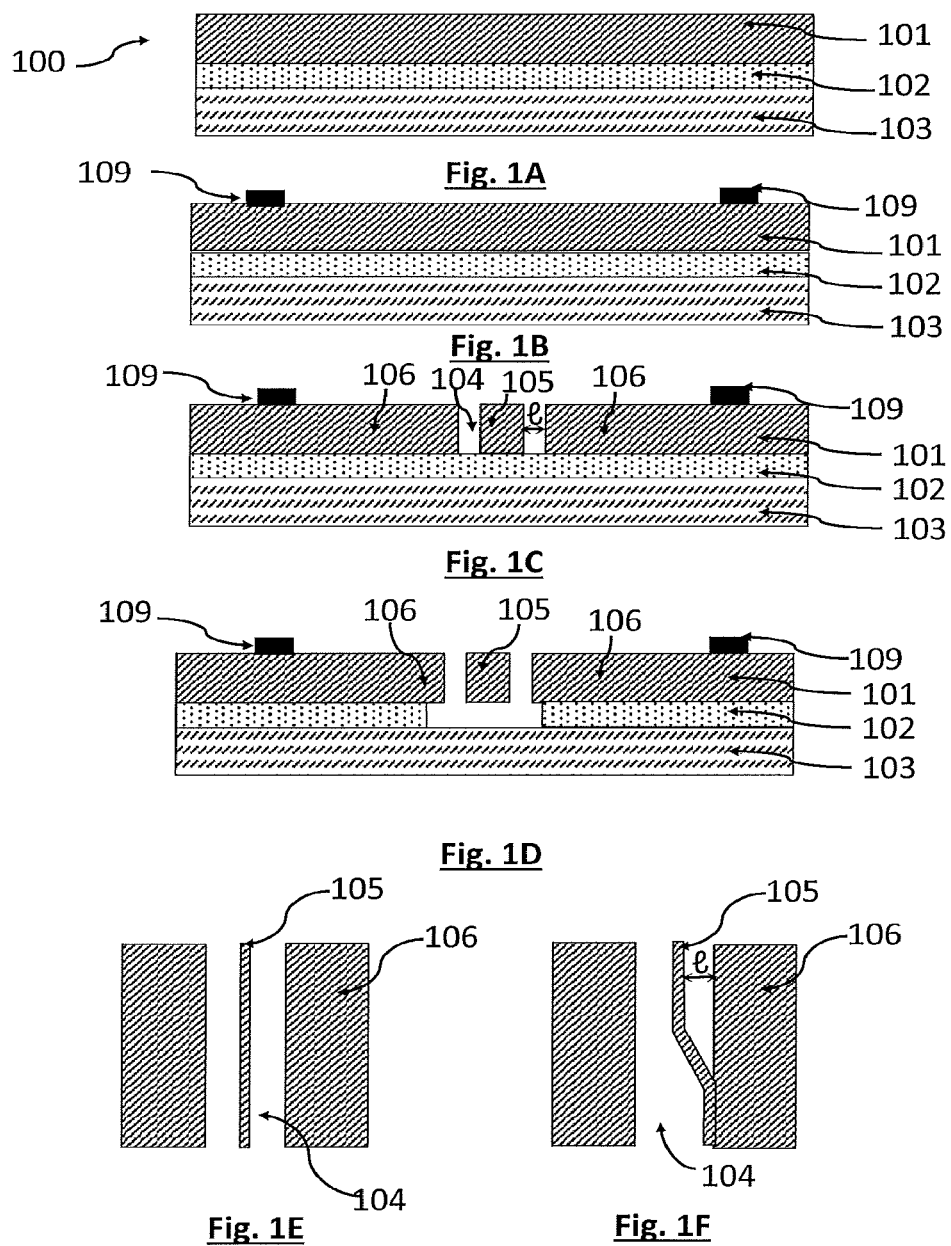

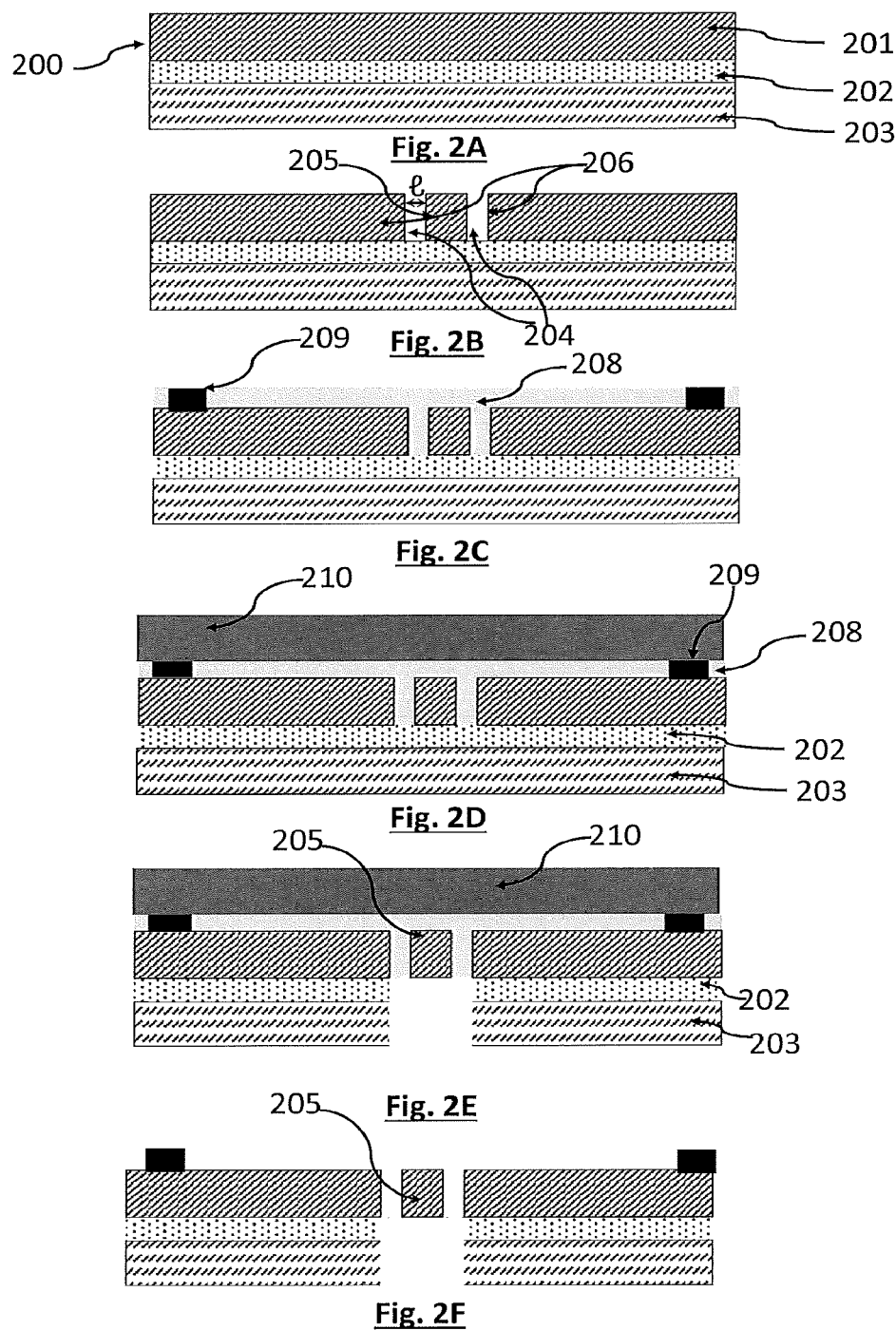

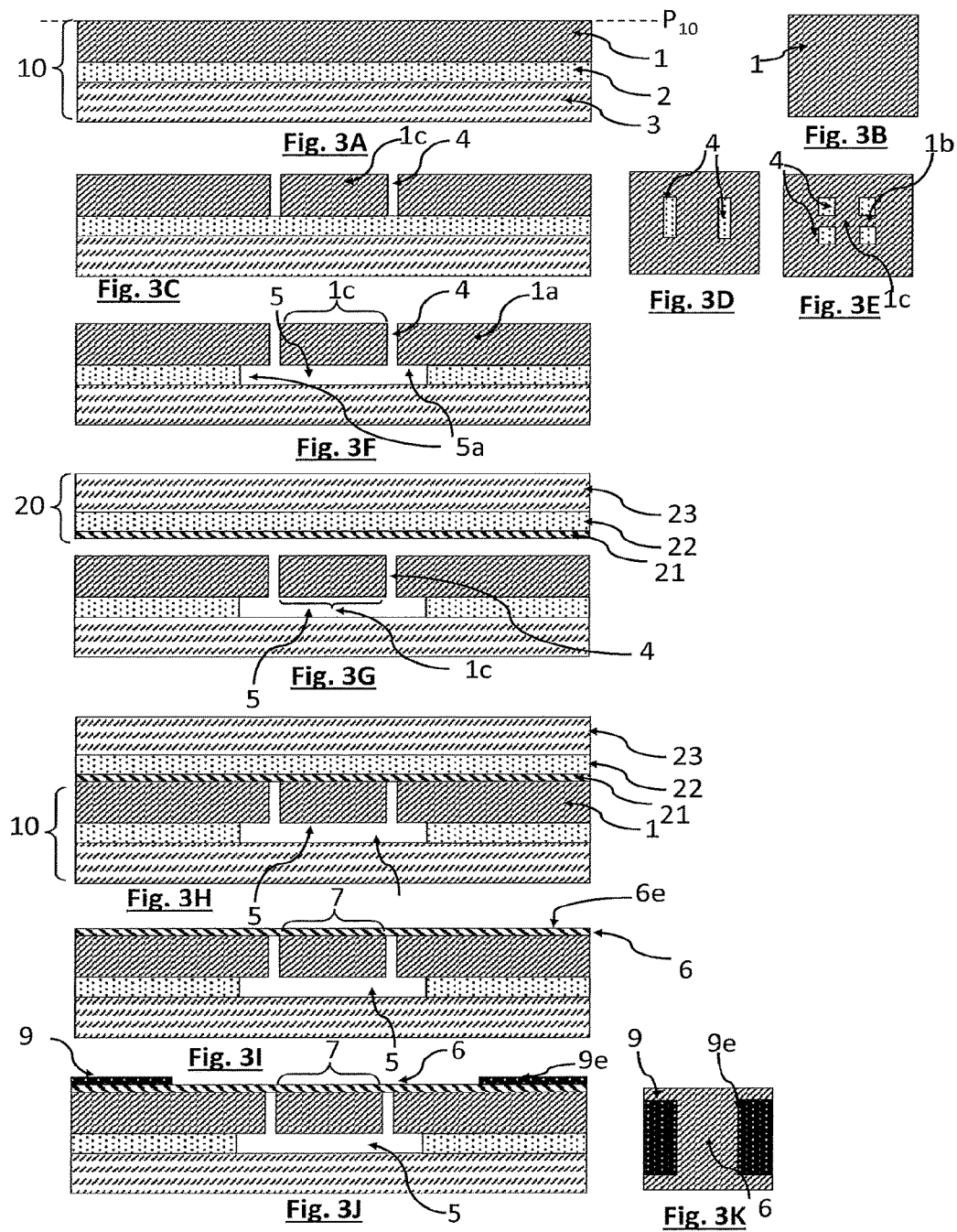

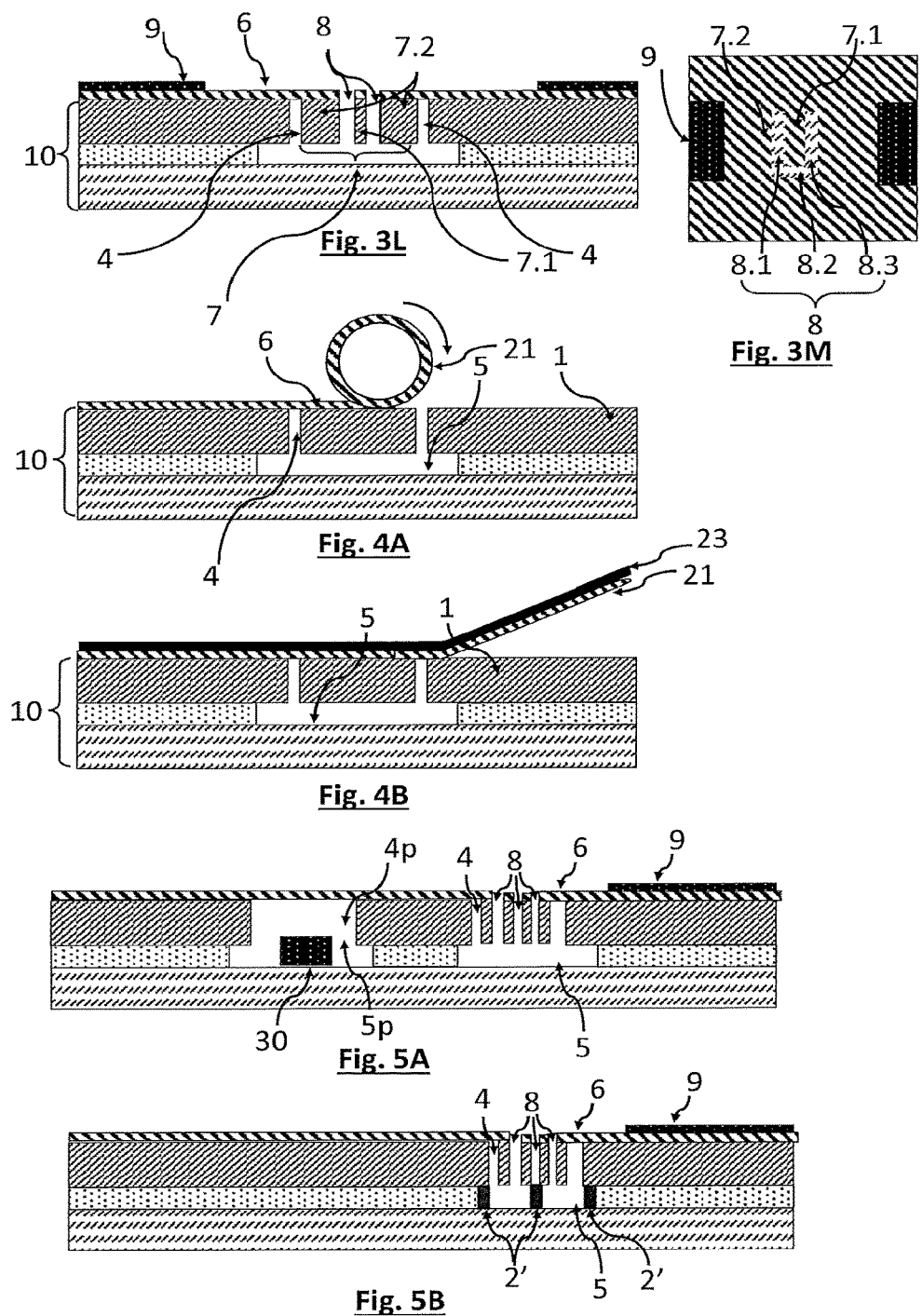

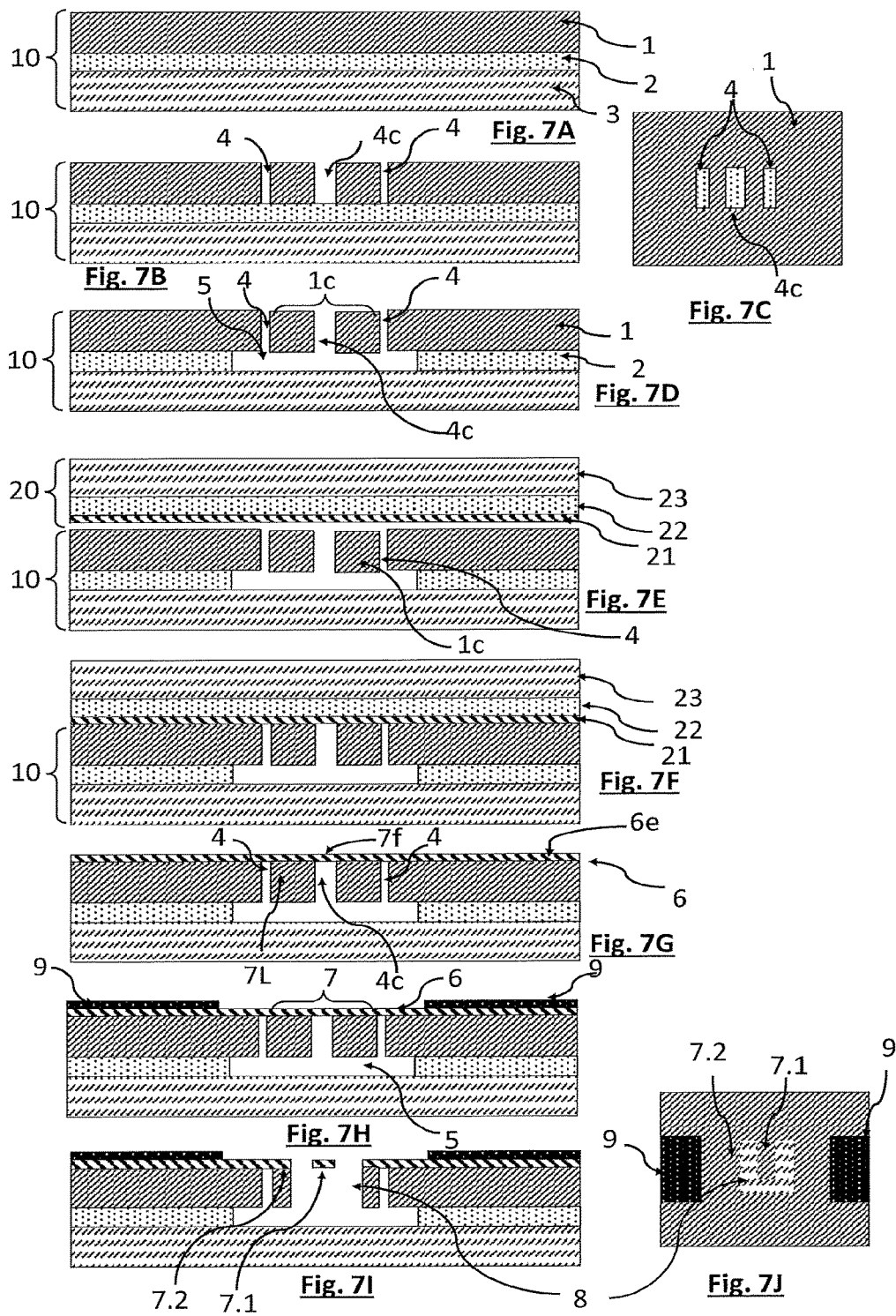

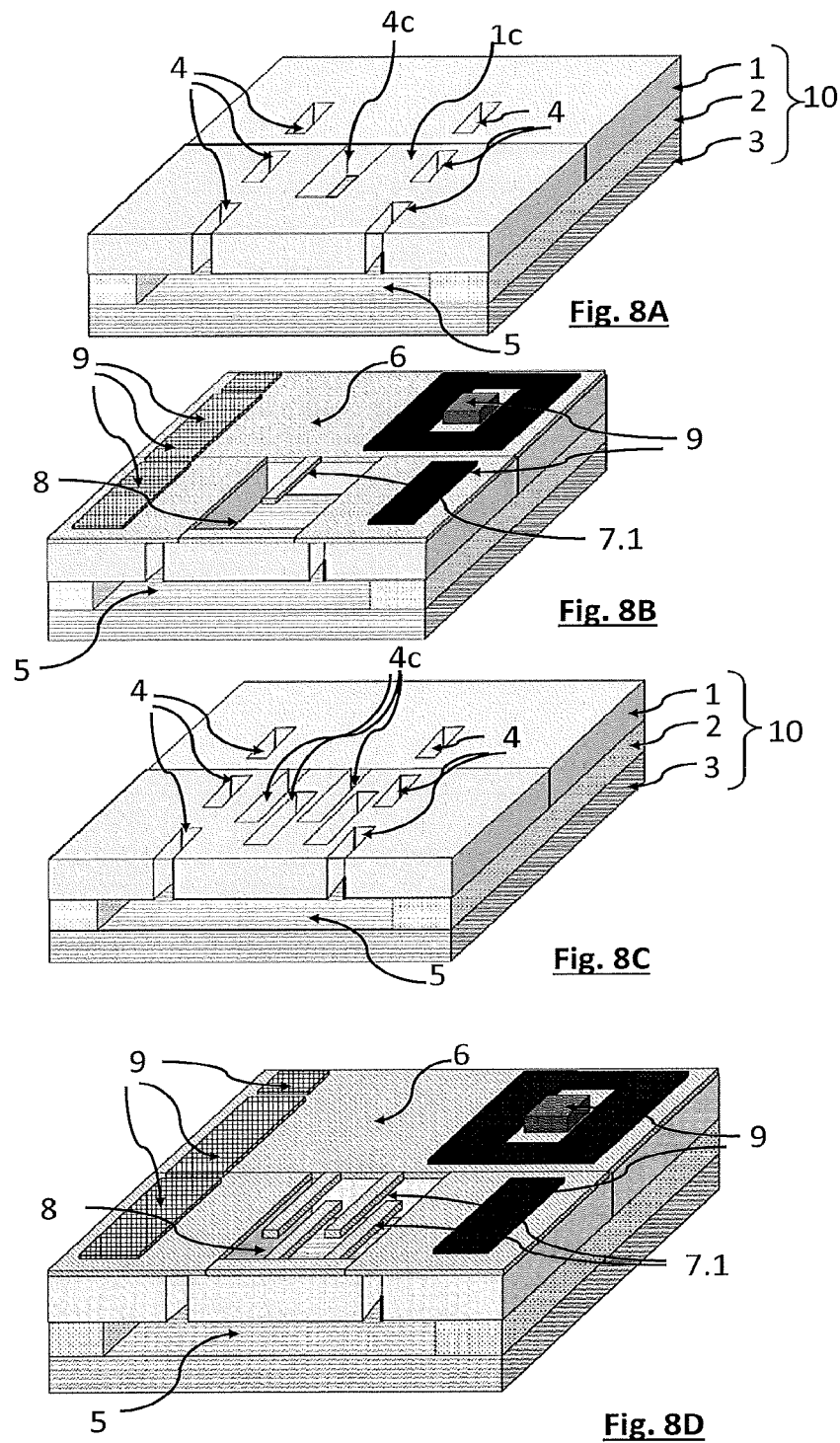

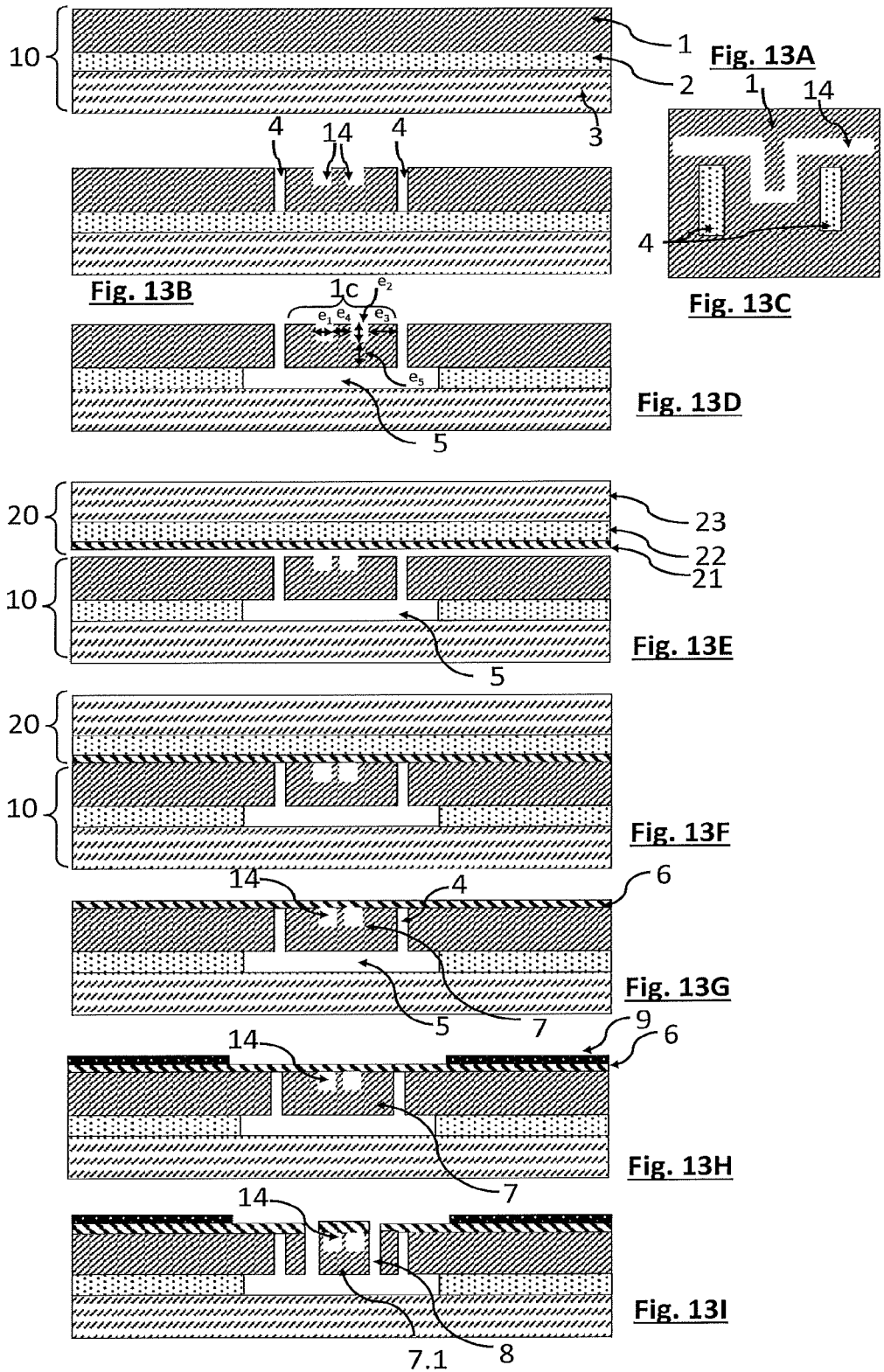

PROCESS FOR PRODUCING AN ELECTROMECHANICAL DEVICE

TECHNICAL FIELD

The technical field of the invention is the fabrication of MEMS- or N EMS-type electromechanical devices, intended to form resonators, switches, or movement detectors.

PRIOR ART

Microelectromechanical systems (MEMS) or nanoelectromechanical systems (NEMS) are commonly used in many industrial fields, where they are used as actuators or as detectors. To give just a few examples, such devices are found in accelerometers, movement or pressure sensors, mobile telephones and this list is far from being exhaustive. Application of these devices to biological or medical analysis has also been the subject of much work.

Many electromechanical devices include a thin movable structure that is said to be suspended above a substrate, the suspended structure being able to deform under the effect of a stress, whether it be a stress due to pressure, or the application of an electric field, via a capacitive effect, or the effect of gravity or even the application of an acoustic wave. Such devices associate a mechanical aspect, here a movement or a deformation of the suspended structure, and electrical means for inducing and/or detecting this movement, hence the use of the term "electromechanical". An electromechanical device may be obtained using various fabrication processes, in which various microfabrication steps are carried out in sequence, allowing a movable structure to be defined in a substrate and, on the same substrate, electrodes to be formed facing so as to allow transduction via capacitive coupling with this movable structure. Certain processes allow a piezoelectric material to be formed superposed on or adjacent to the movable structure; it is then possible to actuate or measure a movement of the movable structure via a piezoelectric transduction. One of these steps is particularly critical: it is a question of what is called the release step, in which a sacrificial layer is removed so that the movable portion overhangs the substrate, and is thus able to move. The release allows the movable portion to be able to move or deform relatively to the substrate, this movement or deformation for example describing undulations or vibrations.

FIGS. 1A to 1D illustrate a conventional process for fabricating an electromechanical device. The process implements a semiconductor substrate 100 including what is called an upper layer 101. This upper layer 101 is superposed on a sacrificial layer 102, the latter itself being superposed on a lower layer 103. The sacrificial layer 102 may be formed from a photoresist, silicon oxide or a dielectric other than silicon oxide, or may even be a metal layer, for example made of gold, or aluminium or an alloy of aluminium or silicon. FIG. 1B shows a step of producing, by photolithography, metal contact pads 109 or conductive metal tracks on the upper layer 101. It is a question of depositing, on the upper layer 101, functional materials having a particular function, for example an electrical conduction function. FIG. 1C shows a step of structuring a movable portion 105 of the device, called a microstructure. In this structuring step, a pattern is etched into the upper layer 101, via a combination of photolithography and etching. This step allows a trench 104, referred to as a separation trench, to be etched around the movable portion 105 in a plane in which the upper layer 101 lies. The movable portion 105 is then located facing a fixed portion 106, the separation trench 104 separating the fixed portion from the movable portion. The width l of the separation trench 104 must be sufficiently small to allow good capacitive coupling between the fixed portion 106 and the movable portion 105 of the device, such that a movement or a deformation of the movable portion 105 may be induced by capacitive coupling and/or detected by capacitive coupling, via electrodes formed in the fixed portion 106.

The releasing step, which is illustrated in FIG. 1D, consists in releasing the microstructure 105 from the sacrificial layer 102. This phase is usually carried out by liquid-phase or vapour-phase chemical etching or by plasma etching, and allows the sacrificial layer 102 to be removed selectively. A cavity is thus formed beneath the microstructure 105 and passivating material filling the separation trench is also removed. This step releases the microstructure 105 the latter then becoming movable with respect to the residual upper layer 101, which forms the fixed portion 106. This etching is usually carried out with an etching solution such as HF (hydrochloric acid) or BHF (buffered hydrofluoric acid) when the sacrificial layer 102 consists of silicon oxide. It is followed by rinsing, in order to remove the chemical etching solution. By "to be removed selectively", what is meant is that the etch mainly, or even exclusively, etches the sacrificial layer 102 and does not affect, or as little as possible, the other constituent layers of the device, in particular the upper layer 101 or the lower layer 103.

Such a process has certain drawbacks. The first drawback is that there is a risk that the microstructure 105 of the device will be damaged during the releasing step. Specifically, since the separation trench 104 is narrow, a portion of the microstructure may deform and adhere to the fixed portion 106 or to the lower layer 103. Such an effect, referred to as stiction, is depicted in FIGS. 1E and 1F, which respectively show, from above, a microstructure 105 before and after release. Under the effect of the creation of a meniscus with a residual liquid, whether it be the etching solution or the rinsing solution, or under the action of surface tensions of such a solution, the microstructure 105 may deform and irreversibly press against the fixed portion 106 or against the carrier layer 103. The risk of this happening increases as the width of separation trench 104 decreases and as the stiffness of the microstructure 105 decreases. Specifically, the adhesion of the microstructure 105 to a fixed wall opposite thereto is due to capillary forces that appear during the formation of a meniscus, and/or to interfacial forces that appear during the contact of the microstructure with said wall. These forces may exceed the stiffness of the microstructure 105, in which case the microstructure will durably adhere to a wall that is opposite thereto, never returning to its initial configuration.

Moreover, the etching phase may have an impact on the integrity of certain structures, in particular the microstructure 105 or the fixed portion 106 that is opposite thereto. This etching phase may also degrade certain functional elements added to the surface of the silicon layer 101, for example the metal contacts 109 described above. Specifically, although the etch rate of certain materials other than the material of the sacrificial layer 102 is low, it is not however zero and structures made from these materials may be damaged and made non-functional.

As a result, recourse to a chemical etch restricts the choice of usable materials. The material from which the sacrificial layer is made must have a high etch rate, whereas the other what are called structural materials or functional materials, for example the metal electrodes 109, must have a low etch rate. This characteristic, referred as etch selectivity, defines the choice of the structural materials and their thickness. The choice of the etching solution depends on the various materials from which the substrate and the elements added to the latter are made.

One alternative is then to cover the most sensitive elements with a protective material, for example a glass cover or a polyimide film. However, such an alternative then requires the protective material to be removed, this possibly also affecting certain materials.

Another process for releasing a microstructure, this process being what is called a "back-side" process, is presented with reference to FIGS. 2A to 2F. These figures show an example of manufacture of an electromechanical resonator, which resonator is described in the publication Agache V "High Q factor plate resonators for ultrasensitive mass sensing applications", Proc. of Transducers 2009, Denver, USA, pp. 1630-1633, 2009. The process implements an SOI (silicon-on-insulator) substrate 200 including an upper layer 201 of single-crystal silicon, of 3 µm thickness, which was grown epitaxially. This upper layer 201 is superposed on a sacrificial layer 202 of silicon oxide, the latter layer itself being superposed on a lower layer 203—see FIG. 2A. FIG. 2B shows a step of structuring a movable portion 205 that is similar to the step described with reference to FIG. 1B. This step allows a trench 204, called a separation trench, to be etched around said movable portion 205 of the device, this portion being referred to as a microstructure. In this example, the width l of the trench is 0.3 µm. FIG. 2C shows the substrate after the separation trench 204 has been filled with high-temperature oxide (HTO) 208, and metal contact pads 209 have been produced on the upper layer 201, without risk of damage to the microstructure 205 or the separation trench 204. These metal pads are then covered with a tetraethyl orthosilicate (TEOS) protective layer 210, this being shown in FIG. 2D. The release of the microstructure 205 is illustrated in FIG. 2E. Contrary to the step illustrated in FIG. 1E, the sacrificial layer 202 is not removed from the front side, i.e. through the upper layer of the substrate, but from the back side, i.e. through the carrier layer 203. This etch also leads to the gradual removal of the oxide layer 208 and the protective layer 210, which removal is shown in FIG. 2F, but it may also deteriorate the functional elements 209 added to the surface of the upper layer 201. Making provision to carry out a wet etch from the back side decreases the risk of vertical stiction (i.e. of adhesion of the microstructure 205 to the lower layer 203) but increases the complexity of the process. Furthermore, the risk of lateral stiction, i.e. the adhesion of the microstructure 205 to the upper layer 201, across the separation trench 204, remains. Lastly, materials having a suitable etch selectivity must be chosen, in order to prevent damage to the movable microstructure released by removing the sacrificial layer 202. The etch rate of the microstructure must be carefully controlled if the dimensions of the latter are small, as in the case of a movable nanostructure of a NEMS.

The back-side etch may be carried out, from the back side, by dry etching, for example by plasma etching through a resist, this avoiding the risk of lateral stiction. Although mainly intended to remove the sacrificial layer 202, such a dry etch may affect the suspended microstructure 205. This point is particularly important when the suspended microstructure is thin, typically in the case of a NEMS, or in the case of a suspended micro- or nano-channel, such configurations being described hereinbelow.

Moreover, the back-side etch requires a thick layer of material, typically of about 700 µm thickness, to be etched. This requires an etch the uniformity of which is high to be used, this possibly proving to be difficult when various cavities, of various sizes, are to be etched in the same substrate, the etch then being faster in larger cavities than in smaller cavities.

The inventors have developed a process that makes it possible to avoid the aforementioned limitations or constraints, namely the stiction effect, the etch-selectivity-constrained choice of structural materials, the risk of damage to the movable microstructure during dry etching, or even possible deterioration of functional elements, for example contact pads, formed on the front side, i.e. on the upper layer. Moreover, the invention allows electromechanical devices to be formed the movable portion of which may have various shapes, without modification of the main steps of the process.

SUMMARY OF THE INVENTION

One subject of the invention is a method for producing an electromechanical device from a substrate, called the base substrate, including an intermediate layer placed between a lower layer and an upper layer, each layer lying parallel to a plane, called the plane of the substrate, the method including the following steps:

a) etching the upper layer so as to form apertures, called first apertures, transversely to the plane of the substrate, the first apertures extending through said upper layer to the intermediate layer;

b) removing a portion of the intermediate layer lying between the first apertures, so as to form an empty cavity in said intermediate layer, said empty cavity lying, in the plane of the substrate, between the first apertures, and below the upper layer;

c) forming a blocking layer on the upper layer, the blocking layer covering the first apertures formed in step a), the blocking layer and the upper layer forming what is called a suspended microstructure lying above the cavity formed in step b), between the first apertures;

d) producing a boundary trench in the suspended microstructure formed in step c), the boundary trench opening onto the cavity formed in step b), the trench separating the suspended microstructure into a fixed portion and a movable portion, the movable portion being able to deform and overhanging the cavity, said movable portion forming a movable member of the electromechanical device.

In step b), the empty cavity lies between the upper layer and the lower layer.

In step c), the suspended microstructure corresponds to a portion of the blocking layer lying between the first apertures.

Step a) forms a section of the upper portion, called the central portion, lying between said apertures. The central portion is preferably such that in step b), its elasto-capillary number is higher than 2.

According to an embodiment, the method may include: prior to step c), forming at least one central aperture, through the upper layer, each central aperture lying, in the plane of the substrate, between at least two first apertures, such that, prior to step c), the central aperture opens onto the cavity; in step c), covering the central aperture with the blocking layer;

in step d), producing a trench around a portion of the blocking layer covering the central aperture, the portion of the blocking layer then forming the movable portion of the electromechanical device.

The method may include, prior to step c), and preferably prior to step b), forming a fluidic channel in the upper layer, such that following step d), said fluidic channel lies in the movable portion. Preferably, the fluidic channel does not pass through the upper layer and is not open onto the empty cavity.

The method may include, between step c) and step d), forming functional elements on the blocking layer, the functional elements having:
an electrical connection function;
or a fluidic function in that they define a fluidic channel in said upper layer;
or a function of detection of a mechanical deformation.

The method may include one of the following features, alone or in any technically possible combination:
step d) is carried out by dry etching;
the upper layer includes or is formed by a conductor, in particular single-crystal silicon;
the intermediate layer is formed by a dielectric, in particular silicon oxide;
the lower layer is formed by a conductor, in particular single-crystal silicon;
the blocking layer is or comprises at least one of the following materials:
  monocrystalline silicon, polysilicon, germanium, gallium arsenide;
  or a dielectric material, in particular chosen from silicon oxide, silicon nitride, a polymer, silicon oxycarbide, Teflon; or
  or a conductor, in particular a metal.
in step c), the blocking layer is formed by chemical vapour deposition, or by sputtering, on the upper layer;
in step c), the blocking layer is formed by thermal oxidation of the upper layer;
the thickness of the blocking layer is smaller than 200 µm;
following step d), the width of the boundary trench, between the fixed portion and the movable portion of the suspended microstructure, is smaller than 10 µm.

According to an embodiment, step c) comprises the following substeps:
ci) applying an auxiliary substrate to the base substrate, the auxiliary substrate including a lower layer, the application of the auxiliary substrate being carried out in such a way that the lower layer of the auxiliary substrate is placed on the upper layer of the base substrate, in contact with the latter;
cii) removing some of the auxiliary substrate, so as to leave all or some of the lower layer of the auxiliary substrate securely fastened to the base substrate in the form of a residual lower layer, the residual lower layer forming the blocking layer.

Substep ci) may include molecular bonding of the lower layer of the auxiliary substrate to the upper layer of the base substrate.

The auxiliary substrate may be unrolled onto the upper layer of the base substrate. The auxiliary substrate may be a flexible substrate.

Another subject of the invention is an electromechanical device obtained using a process such as described in this application.

Other advantages and features will become more clearly apparent from the following description of particular embodiments of the invention, which embodiments are given by way of nonlimiting example, and shown in the drawings listed below.

FIGURES

FIGS. 1A to 1D illustrate an example of a process for producing an electromechanical device according to the prior art.

FIGS. 1E to 1F schematically respectively show a microstructure before and after its release, the latter being accompanied by a lateral stiction effect.

FIGS. 2A to 2F show another example of a process for producing an electromechanical device according to the prior art.

FIGS. 3A to 3M illustrate an example of a process for producing an electromechanical device according to a first embodiment of the invention.

FIGS. 4A and 4B show variants allowing the application of a blocking layer, these variants possibly applying to all of the embodiments of the invention.

FIG. 5A shows a variant of the first embodiment. FIG. 5B illustrates another variant.

FIGS. 7A to 7J show an example of a process for producing an electromechanical device according to a second embodiment of the invention.

FIGS. 8A to 8D illustrate the main steps of the production of an electromechanical device according to the second embodiment.

FIGS. 13A to 13I show an example of a process for producing an electromechanical device according to a third embodiment of the invention.

DESCRIPTION OF PARTICULAR EMBODIMENTS

Figure 6A:
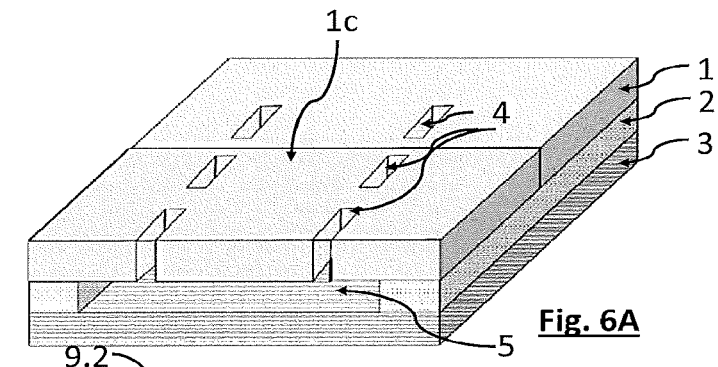
FIGS. 6A to 6D illustrate the main steps of production of an electromechanical device according to the first embodiment.

FIGS. 3A to 3M illustrate the steps of a first embodiment intended to produce a microelectromechanical system (MEMS) or nanoelectromechanical system (NEMS).

A silicon-on-insulator (SOI) substrate 10, called the base substrate, is provided. This substrate comprises an insulating intermediate layer 2 placed between an upper layer 1 made of silicon, and preferably made of single-crystal silicon, and a lower layer 3 made of silicon. These three layers lie parallel to a plane $P_{10}$ called the plane of the substrate. The intermediate layer 2 consists of what is called a buried oxide layer, usually designated by the acronym BOX (for Buried OXide). It is preferably silicon oxide ($SiO_2$). The intermediate layer 2 serves as an etch stop layer and as a sacrificial layer, as described below. A dielectric is preferably used to form this layer, because this makes it possible to avoid short-circuiting a plurality of electromechanical devices formed in the same substrate. The thickness of the intermediate layer 2 is preferably comprised between a few tens of nanometres and a few microns, typically in the range 50 nm-5 µm, and preferably between 100 nm and 2 µm—it is for example 2 µm. Its thickness is dimensioned such that during its removal by wet etching, the risk of stiction is minimized, as described with reference to FIG. 3F.

The upper layer 1 is, in this example, made of single-crystal silicon, the latter being preferred, with respect to polycrystalline silicon, because of its better acoustical and mechanical properties, this allowing energy dissipation to be minimized. The quality of a resonator-type electromechanical device is usually quantified by a quality factor, representing the sharpness of a resonant peak. This resonant peak appears in a frequency spectrum, representing the amplitude of the movement of the resonator, whether it be an undulation or vibration, as a function of frequency. The quality factor, at a resonant frequency, is determined from a width of the resonant peak appearing at the resonant frequency, for example its full width at half maximum. It may in particular correspond to a ratio between said full width at half maximum and the resonant frequency. The use of single-crystal silicon allows high quality factors to be obtained, because of the minimization of energy dissipation. For this reason, the base substrate 10 is preferably an SOI substrate.

The thickness of the upper layer 1 is preferably comprised between a few tens of nanometres and a few hundred microns, typically in the range 50 nm-200 μm, and preferably between 100 nm and 5 μm—it is for example 500 nm. This upper layer may be subjected to a prior step of epitaxial growth of silicon, this allowing its thickness to be adjusted. The upper layer 1 may also be subjected to a prior step of implanting dopants in order to adjust its electrical conductivity. The dopants may be chosen from boron, phosphorus and arsenic. The implantation of such dopants is known to those skilled in the art.

The function of the lower layer 3 is to carry the intermediate and upper layers. It may be made of semiconductor single-crystal silicon or of an amorphous material, for example glass. Its thickness is typically comprised between a few tens of pm and a few hundred μm, or even a few millimetres. For example, when a substrate of 200 mm diameter is used, the thickness of the lower layer 3 is 725 μm.

Alternatively, the base substrate 10 may accommodate CMOS—(Complementary Metal-Oxide Semiconductor) or MOS-type components including an upper layer made of silicon or polysilicon, and incorporating an intermediate layer made of oxide, $SiO_2$ for example. In this case, the substrate undergoes a preliminary step of polishing, so that the surface finish of the upper layer 1 is compatible with the subsequent steps of the process, in particular the step of forming a blocking layer 6 described below. The CMOS components may be incorporated into the upper layer 1 or into the lower layer 3. The CMOS components may serve to electrically address the electromechanical device formed by the intervention, or to detect a movement of a movable portion of the device. When the CMOS components are integrated into the lower layer 3, vias may pass through the intermediate layer 2 in order to ensure the electrical connection with the electromechanical device formed by the invention.

Another alternative is to use a multilayer substrate of the graphene/oxide/single-crystal-silicon type.

FIG. 3B is a top view of the substrate shown in FIG. 3A.

FIG. 3C shows a step of structuring the upper layer 1 by forming apertures 4, referred to as first apertures. These apertures are preferably formed by photolithography followed by etching. The photolithography allows a pattern to be formed in a photoresist deposited on the surface of the upper layer 1, this pattern allowing first apertures 4 to be defined in the resist. The first apertures 4 are transferred to the plane $P_{10}$ of the substrate 10 by dry etching. Thus, the first apertures 4 may take the form of trenches, of holes of square or polygonal cross section, or of holes the cross section of which is any other shape defined beforehand by photolithography. The first apertures 4 lead into or open onto the intermediate layer 2. The etching is preferably dry anisotropic etching, the intermediate layer 2 playing the role of etch stop layer. Preferably, at least one dimension of these first apertures 4, in the plane $P_{10}$ of the substrate, is smaller than 10 μm, and preferably about 1 μm. FIGS. 3D and 3E are top views of the substrate 10 after first apertures 4 taking the form of trenches and holes of square cross section, respectively, have been formed. The first apertures 4 bound a portion of the upper layer 1, called the central portion 1c, lying between said first apertures. The portion of the upper layer complementary to said central portion 1c is called the adjacent portion 1a. Moreover, as may be seen in FIG. 3D, the space between two apertures may form an anchor 1b, the utility of which is demonstrated below.

FIG. 3F illustrates a step, called the pre-releasing step, in which a portion of the intermediate layer 2, lying between the first apertures 4, below the central portion 1c, is removed. The intermediate layer 2 then plays the role of sacrificial layer, in an analogous way to the processes known from the prior art. This step gradually produces an empty cavity 5 lying, parallel to the plane $P_{10}$ of the substrate, between the first apertures 4 and, in a plane perpendicular to the plane of the substrate, under the central portion 1c. This pre-releasing step may be carried out by wet etching, for example etching using a hydrofluoric acid (HF) or buffered hydrofluoric acid (BHF) solution, or by vapour-phase etching (hydrofluoric acid in vapour form). For reasons inherent to anisotropic etching, the intermediate layer is also removed beyond the space bounded by the first apertures. Thus, in the vicinity of the first apertures 4, the cavity extends under the adjacent portion 1a of the upper layer 1, as is illustrated by reference 5a in FIG. 3F.

An important element is that the dimensions of the central portion 1c and of the first apertures 4 be determined such that the central portion 1c is sufficiently rigid to prevent any stiction effect between the central portion 1c and, on the one hand, the adjacent portion 1a (lateral stiction) or, on the other hand, the lower layer 3 (vertical stiction). This is a notable advantage of the invention: the sacrificial layer is removed while the central portion 1c is rigid enough to prevent the occurrence of a stiction effect. In addition, depending on the topology of the first apertures 4, anchors 1b may reinforce the rigidity of the central portion 1c. Specifically, during this removal, the central portion has an elasto-capillary number higher than 1, this making it possible to avoid the occurrence of a stiction. The elasto-capillary number is defined below. Specifically, regarding physical parameters that may possibly promote its appearance, stiction depends on the elastic stiffness of the microstructure 1c, and on the thickness of the intermediate layer 2. In this step, it is ensured that these parameters are dimensioned so as to prevent stiction, this amounting to an elastic-capillary number higher than 1. Conversely to the prior art, the removal of the sacrificial layer is not a final step, in which the movable portion of the electromechanical device is released, but an intermediate step of the process, implemented without risk of stiction. The process is thus more reliable than processes of the prior art based on release of a movable microstructure by wet etching.

FIGS. 3G and 3H show a step of joining what is called a blocking layer to the upper layer 1. In FIG. 3G, a substrate 20, called the auxiliary substrate, a first end of which is formed by a lower layer 21, called the blocking layer, has been illustrated. This auxiliary substrate includes a sacrificial layer 22, borne by a carrier layer 23. The auxiliary layer 20 may be an SOI substrate, in which case the lower layer 21 is a layer of single-crystal silicon, the sacrificial layer 22 consists of $SiO_2$ and the carrier layer 23 is formed from single-crystal silicon.

As shown in FIG. 3H, the auxiliary substrate 20 is applied to the base substrate 10, such that the lower layer 21 of the auxiliary substrate presses against the upper layer 1 of the base substrate 10 and, as a result, bonds to the latter. According to a first possibility, the upper layer 1 of the base substrate 10 and the lower layer 21 of the auxiliary substrate 20 are bonded to each other by molecular bonding. A chemical clean and a preparation phase may be carried out before these two layers are brought into contact, a vacuum anneal being carried out thereafter. The preparation phase, known to those skilled in the art, consists in activating the surfaces of each layer with a view to promoting molecular adhesion between the two layers once they are brought into contact. It will be noted that, because of the mechanical rigidity of the central portion 1c, there is no risk of stiction during the cleaning and preparation phases preceding the bonding. An example of preparation consists in making the surfaces hydrophobic with a 15- to 20-second treatment in HF diluted to 1%. The annealing phase allows the bonding energy to be increased. It may for example be carried out at a temperature exceeding 600° C., or even 1200° C., for 2 hours.

According to one variant, before the two substrates are brought into contact, the lower layer 21 of the auxiliary substrate 20 is covered with an $SiO_2$ oxide layer advantageously formed by thermal oxide growth. When brought into contact, the upper layer 1 of the base substrate 10 and the lower layer 21 of the auxiliary substrate 20 then bond by hydrophilic molecular bonding. Alternatively, or in addition, an oxide layer may be formed on the upper layer 1 of the base substrate 10, this also allowing the lower layer 21 of the auxiliary substrate 20 to be bonded to the upper layer 1 of the base substrate 10 by hydrophilic molecular bonding.

The following step, illustrated in FIG. 3I, consists in removing the carrier layer 23 of the auxiliary substrate, and the sacrificial layer 22 of the latter. The carrier layer 23 may be removed by mechanical abrasion, or by chemical etching. The sacrificial layer 22 then acts as stop layer for the etching. The latter may then be removed by chemical etching, in such a way as to maintain the integrity of the lower layer 21. When the lower layer is made of single-crystal silicon and the sacrificial layer 22 is formed from $SiO_2$, an HF chemical etch may for example be used. The lower layer 21 then forms a layer, called a blocking layer 6, on the base substrate 10.

According to one variant, the auxiliary substrate may be formed from a carrier layer 23, for example made of single-crystal silicon, covered with a lower layer 21 of silicon oxide $SiO_2$. The latter may be joined to the upper layer 1 of the base substrate 10 by hydrophilic molecular bonding. The carrier layer 23 is then removed by mechanical abrasion followed by a chemical etch with tetramethylammonium hydroxide (TMAH). The blocking layer 6 is then the residual layer of silicon oxide, i.e. the lower layer remaining after the carrier layer 23 has been removed.

The principle of bonding a blocking layer 6 to the upper layer 1 of the base substrate 10 is not applicable solely to the examples described above and may also be used to bond blocking layers 6 made of other materials, for example of sapphire, silicon carbide, gallium nitride (GaN), $LiNbO_3$, Ge, GaAs, InP, $Si_3N_4$, oxides such as $ZrO_2$, $SrTiO_3$, $LaAlO_3$, MgO, etc. In addition, this step of joining by molecular bonding followed by a removing step may be carried out a plurality of times consecutively, so as to form a composite blocking layer formed gradually by successively bonding various layers, optionally from different materials, to the upper layer 1. Alternatively, a composite blocking layer 6, formed from a stack of a plurality of layers formed on one and the same auxiliary substrate, may be bonded.

The thickness of the blocking layer 6 is preferably comprised between 50 nm and 10 µm, and preferably comprised between 50 nm and 500 nm. The blocking layer then takes the form of a membrane securely fastened to the upper layer 1. The blocking layer extends over the central portion 1c described above and covers the first apertures 4.

As shown in FIGS. 4A and 4B, a blocking layer 6 may also be formed on the upper layer 1 of the base substrate 10 using a process in which a layer 21 is added to the upper layer 1 of the base substrate 10, the added layer 21 adhering to the upper layer 1 so as to form the blocking layer 6. The layer 21 may be flexible and unrolled onto the upper layer 1, so as to form the blocking layer 6 as shown in FIG. 4A. The blocking layer 6 may also be formed by adding an auxiliary substrate 23, bearing a lower layer 21, to the upper layer 1, the auxiliary substrate 23 then being removed whereas the lower layer 21 remains securely fastened to the upper layer 1 so as to form the blocking layer 6 (FIG. 4B). In FIG. 4B, a flexible auxiliary substrate 23 has been shown. Such an auxiliary substrate 23 is for example made of polydimethylsiloxane (PDMS). The blocking layer 6 may then take the form of a film made of a polymer, for example of Kapton (registered trademark), polyimide or of polyethylene terephthalate, or of a metal, or of a dielectric layer. The adhesion of the blocking layer 6 to the upper layer 1 is obtained by adapting parameters of application such as pressure and/or temperature.

Alternatively, the blocking layer 6 may be formed on the upper layer 1 by plasma-enhanced chemical vapour deposition (PECVD) or by low-pressure chemical vapour deposition (LPCVD). These deposition techniques make it possible to form a blocking layer 6 that closes the first apertures 4 without penetrating into the cavity 5 formed beforehand. These depositions may be followed by a step of chemical-mechanical polishing (CMP).

Alternatively, the blocking layer 6 may be formed by sputtering. This type of deposition, known to those skilled in the art, allows metals and alloys to be deposited in thin layers. In the present case, depending on the deposited thickness of material, the application of this process allows the first apertures 4 to be gradually blocked and can lead to complete blockage thereof, in particular when the width of the first apertures does not exceed 10 µm.

Alternatively, the blocking layer 6 is formed by thermal oxidation of the upper layer 1. Thermal oxidation, which is also known to those skilled in the art, is a reaction allowing silicon oxide to be grown. This reaction requires the presence of surface silicon, and in particular silicon to be present on the surface of the material forming the upper layer 1 including the internal walls of the apertures 4. The rate of growth of silicon oxide increases with the temperature of the process, and it is possible to employ this process to grow several µm of $SiO_2$; hence it may be used to close the first apertures 4.

The alternative methods described above (chemical vapour deposition, sputtering, thermal oxidation) are envisageable because the first apertures are of small width, i.e. of a width smaller than 10 µm.

At the end of the step of applying the blocking layer 6 to the upper layer 1 of the base substrate 10, the latter includes what is called a suspended microstructure 7 formed by the sections of the upper layer 1 and of the blocking layer 6 lying between the first apertures 4. This suspended microstructure 7 corresponds to the central portion 1c and to the section of the blocking layer 6 that was joined thereto.

Moreover, at the end of this step, the blocking layer 6 has a free surface 6e devoid of any topology. Such a surface is accessible and propitious to the implementation of a functional architecture, including functional elements 9 having electrical functions, or microfluidic functions in that they for example define a fluidic pathway in the blocking layer 6. This functional architecture may for example comprise defining hydrophobic and/or hydrophilic zones by chemical functionalization of the blocking layer 6 or by applying, to the latter, materials with hydrophobic or hydrophilic properties. It may also comprise elements for detecting a mechanical deformation, such as strain gauges, allowing a deformation to be measured and a signal depending on said deformation to be produced, for example via a piezoresistive effect. This step, referred to as the post-processing step, is illustrated in FIG. 3J, in which the integration of electrical connection pads 9e has been shown. FIG. 3K is a top view of the substrate illustrated in FIG. 3J. Functional elements 9 of the functional architecture may be structured by implementing conventional microfabrication technologies: photolithography, etching, deposition by PECVD, evaporation or sputtering.

The step illustrated in FIG. 3L is a step of defining a movable portion of the electromechanical device. This step comprises forming, through the suspended microstructure 7, a boundary trench 8 of pre-set pattern, the trench opening onto the cavity 5. The boundary trench allows the suspended microstructure 7 to be segmented into a movable portion 7.1, which is able to deform, statically or dynamically, and into a fixed portion 7.2, which is securely fastened to the substrate 10. By able to deform, what is meant is able to undulate or vibrate, in the plane $P_{10}$ of the substrate or transversely to this plane, this corresponding to a dynamic deformation, or able to deform statically, the movable portion then making a simple movement. The boundary trench 8 is for example a discontinuous open line, such as shown in FIG. 3M, formed by three trenches 8.1, 8.2 and 8.3 that are orthogonal pairwise. This step includes a phase of defining a pattern representing the trench on the blocking layer 6, and more precisely on the free face 6e of the blocking layer, then the actual etching step. The pattern of the trench may be defined by lithography, for example photolithography. This phase of defining the pattern is followed by a phase of dry etching, for example of plasma etching. The process allows a great deal of freedom as to the definition of the shape of the movable portion 7.1 of the device, the latter being set by the lithography of the pattern used to define the trench. The movable portion 7.1 may thus have various shapes, in particular a disc shape, a ring shape, an ellipse shape, a plate shape, a beam shape, or a combination of such shapes. Whatever the shape of the trench 8, the latter may be segmented into a plurality of segments, so as to form anchors between the movable portion 7.1 and the fixed portion 7.2, between two adjacent segments.

Contrary to prior-art processes, the movable portion 7.1 of the device is defined after the sacrificial layer 2 has been removed, this avoiding the aforementioned risks, in particular the risk of stiction and the risk of damage of the movable portion 7.1 during the removal of the sacrificial layer. In addition, this process allows the choice of usable materials, including the choice of materials from which the functional elements 9 may be made, to be increased, and is not subject to the etch-selectivity constraints affecting prior-art processes. It will also be noted that this process does not require operations to be carried out from the back side of the substrate, i.e. implementing an etch of the lower layer 3.

The blocking layer 6 also allows a functional architecture to be formed on its free surface 6e, without exposing the first apertures 4 to the etching steps allowing the functional elements 9 of this architecture to be formed.

Thus, the process includes 4 main steps:
forming first apertures 4 (see FIG. 3C);
removing the sacrificial layer 2, in order to obtain what is called a central portion 1c that is suspended above the lower substrate 3 (see FIG. 3F);
applying the blocking layer 6 (see FIGS. 3G to 3I) to the upper layer 1, so as to form a suspended microstructure 7 corresponding to the bonded blocking layer 6 and central portion 1c; and
defining the suspended microstructure by etching the boundary trench 8 (see FIG. 3L) so as to define a movable portion 7.1 and a fixed portion 7.2 in the suspended microstructure 7.

During the removal of the sacrificial layer 2 by wet etching, the risk of stiction is avoided because of the mechanical stiffness of the central portion 1c. A person skilled in the art will be able to dimension such a central portion, such that this risk of stiction is avoided, on the basis for example of the analytical models described in the publications Mastrangelo "Mechanical stability and adhesion of microstructures under capillary forces—part I: Basic theory", J. Microelectromech. Sys., 2. No. 1 pp 33-43 and Mastrangelo "Mechanical stability and adhesion of microstructures under capillary forces—part II: experiments", J. Microelectromech. Sys., 2. No. 1 pp 44-55, 1993. More precisely, these models allow adimensional parameters depending on structural characteristics related to the dimensions and materials employed to be determined. The parameters determined and defined in these publications for various geometries are in particular the elasto-capillary number and the peel number. When these numbers are higher than 1, the risk of stiction is avoided: the elastic return forces exceed the capillary forces. The advantage of the process is that the step, referred to as the pre-releasing step, consisting in defining a central portion 1c of the upper layer 1, suspended above the cavity 5, is carried out while the dimensions of the central portion 1c are larger than those of the movable portion 7.1 of the device that will be produced subsequently. This allows the configuration used to be such that, according to the aforementioned analytical models, the risk of stiction is negligible.

According to one example embodiment, in the step of forming the first apertures 4, what is called a peripheral aperture 4p, i.e. an aperture not located between two first apertures 4, may be formed. The removal of the sacrificial layer 2 allows a peripheral cavity 5p to be formed. The process then includes, prior to the deposition of the blocking layer 6, depositing and structuring a conductor, for example an electrode 30 able to bias the lower layer 3. It is then possible to obtain a potential difference on either side of the movable portion of the electromechanical device. This example is shown in FIG. 5A. This allows electrochemical sensors to be formed, or an electrophysiological measurement to be taken. The latter may then be covered with a pierced membrane, the electrode 30 taking an electrophysiological measurement as described for example with reference to FIG. 7 of document WO2006131679. The material deposited in the peripheral cavity 5p may also be a getter, so as to maintain a vacuum level around the movable portion 7.1.

According to one embodiment, schematically shown in FIG. 5B, the process includes structuring the intermediate layer 2 so as to form pads 2' made of a material forming an etch stop layer for the etching of the intermediate layer. Such pads may be inserted into the intermediate layer beforehand during the fabrication of the substrate 10, as for example described in U.S. Pat. No. 6,670,677.

These pads limit under-etching, i.e. the etching of the intermediate layer beyond the space 5a lying between two first apertures 4, which space was described with reference to FIG. 3F. In the pre-releasing step, the intermediate layer 2, lying between the first apertures 4, is removed, with the exception of the pads 2'. The pads 2' may be placed plumb with the suspended microstructure 7, so as to form pins limiting locally the amplitude of the movement of the movable portion 7.1. When the intermediate layer is made of silicon oxide ($SiO_2$), the pads 2' may be made of silicon nitride ($Si_3N_4$).

Figure 6B:
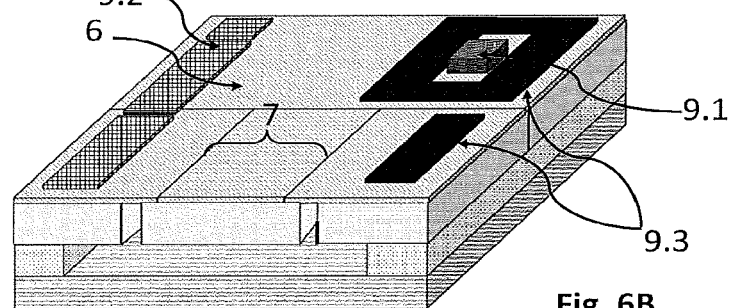
Figure 6C:
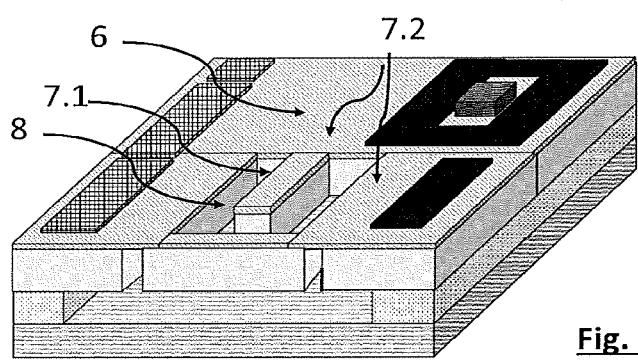
Figure 6D:
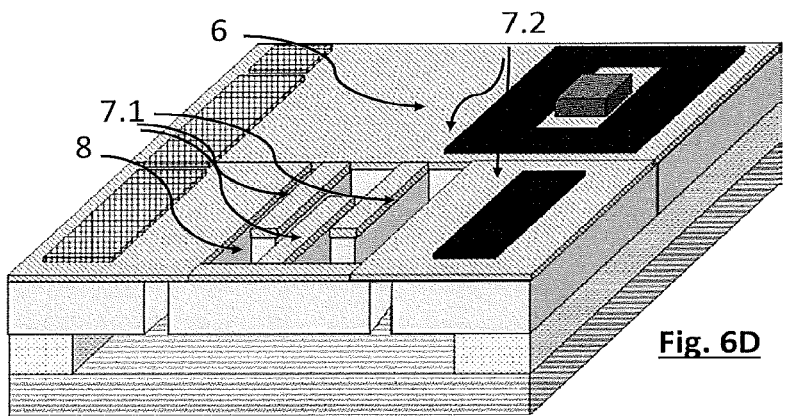

FIGS. 6A to 6D show various steps for producing a substrate according to this third embodiment. FIG. 6A shows the formation of first apertures 4 and the formation of a cavity 5 by removal of a portion of the sacrificial layer 2 located between said first apertures. FIG. 6B shows what are called post-processing steps, which are carried out after the blocking layer 6 has been applied to the upper layer 1, these post-processing steps resulting in the formation of functional elements 9 on the surface of this blocking layer 6. By way of nonlimiting example, the formation of a metal layer 9.1, of dielectric layers 9.2 and of hydrophobic layers 9.3 has been shown. FIG. 6C shows the substrate after a beam-shaped movable portion 7.1 of the device has been defined, the etched trench 8 encircling this movable portion. FIG. 6D shows another example embodiment, in which the etched trench 8 defines not one movable portion 7.1 but three beam-shaped movable portions. It will be understood that, depending on the etching pattern, the invention allows an array of electromechanical devices to be formed on the same substrate, each electromechanical device being associated with one movable portion.

FIGS. 7A to 7J illustrate another embodiment, allowing a particularly thin movable portion 7.1 to be obtained, the thickness of which corresponds to that of the blocking layer 6. FIG. 7A shows the base substrate 10. FIG. 7B illustrates the formation of first apertures 4, but also the formation of what is called a central aperture 4c, formed between at least two first apertures 4. FIG. 7C is a view from above of the substrate shown in FIG. 7B. FIG. 7D shows the step of removing a portion of the intermediate layer 2 lying between the first apertures 4 by wet etching, such as described with reference to FIG. 3F. FIGS. 7E to 7G illustrate the formation of the blocking layer 6 using an auxiliary substrate 20, in the same way as described with reference to FIGS. 3G and 3I. It will be noted that the blocking layer 6 covers the central aperture 4c. Thus, after the blocking layer 6 has been applied, the suspended microstructure 7 comprises what is called a thick portion 7L formed by the bonded blocking layer 6 and upper layer 1, and what is called a thin portion 7f including only the blocking layer.

FIG. 7H shows the deposition of functional elements 9 on the blocking layer 6, as described with reference to FIG. 3J. FIGS. 7I and 7J illustrate the definition of a movable portion 7.1, this movable portion being defined by etching a trench around the movable portion. FIG. 7J corresponds to a view from above of the substrate shown in FIG. 7I.

The key point of this embodiment is the obtainment of a movable portion 7.1 the thickness of which corresponds to the thickness of the blocking layer 6, i.e. to the thickness of the thin portion 7f. The process thus allows a movable portion to be formed the thickness of which may be smaller than 200 nm, or even than 100 nm, thereby allowing an NEMS electromechanical device to be produced. The boundary trench 8 is arranged so as to remove all or some of the thick portion 7L, and so as to leave behind the blocking layer 6 overhanging the central aperture 4c. This allows a movable portion 7.1 that is as thin as the blocking layer 6 to be formed.

FIGS. 8A to 8D show examples of production of substrates according to the embodiment described with reference to FIGS. 7A to 7J. FIGS. 8A and 8B illustrate a first example, FIG. 8A showing the base substrate 10 after first apertures 4 have been formed and a central aperture 4c placed between said first apertures, and after the intermediate layer 2 placed between the first apertures 4 has been removed. FIG. 8B shows the electromechanical device obtained after the movable portion 7.1 has been defined, the latter being formed solely from the blocking layer 6. A very thin movable portion 7.1 results.

FIGS. 8C and 8D illustrate a second example, FIG. 8C showing the base substrate 10 after first apertures 4 and a plurality of central apertures 4c have been formed, each central aperture being located between at least two first apertures 4; and after the intermediate layer 2 placed between the first apertures 4 has been removed. During the step of applying the blocking layer 6, the latter covers both the central apertures 4c and the first apertures 4. The trench 8 is then etched so as to remove the suspended microstructure 7 with the exception of the blocking layer deposited on all or some of each central aperture 4c. Just as in the preceding example, the etching of the boundary trench 8 allows a thin movable portion 7.1 that is contained within the perimeter of a central aperture 4c to be formed. As shown in FIG. 8D, an array including four electromechanical devices is then obtained, the movable portion 7.1 of each being as thin as the blocking layer 6.

Thus, the process allows a thin movable portion 7.1 forming a NEMS to be obtained in a wide variety of geometrical configurations, the latter essentially depending on the pattern in which the trench 8 is etched, in the last step of the process described above, no other constraints, for example constraints related to stiction, needing to be satisfied.

Figure 9A:
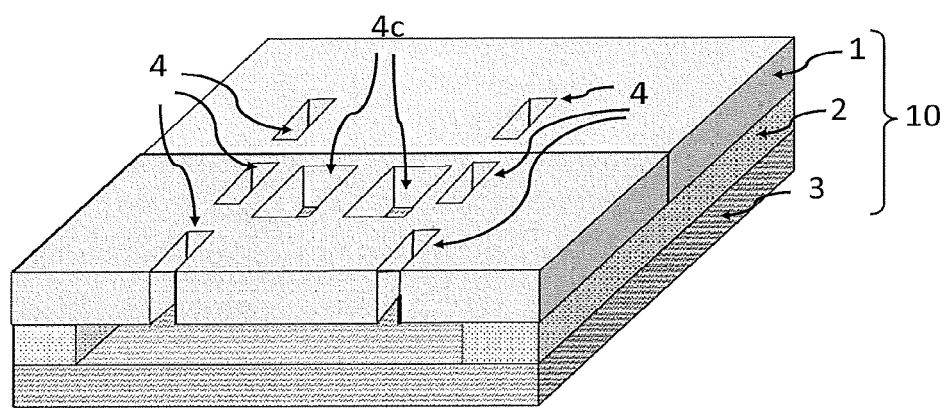
FIGS. 9A to 9B illustrate the main steps of the production of another electromechanical device according to the second embodiment.
Figure 9B:
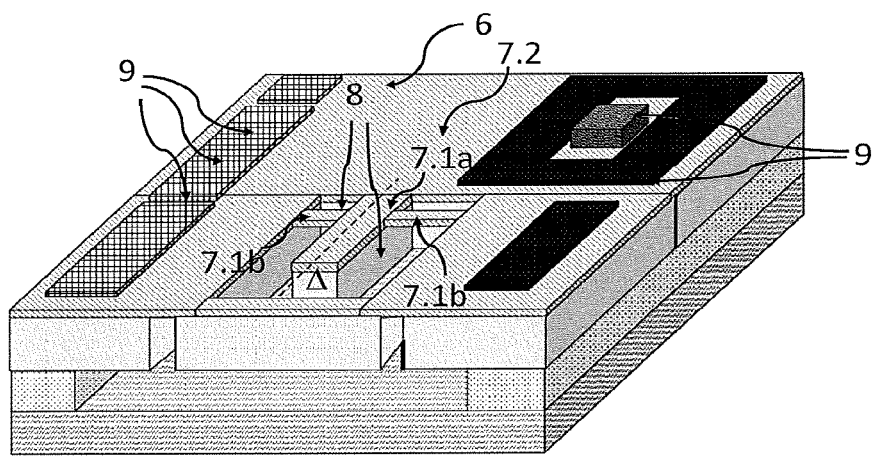

FIGS. 9A to 9B show an example of production of what is called a hybrid configuration, the movable portion of the electromechanical device including a thin section consisting solely of the blocking layer 6, and a thick section, consisting of the bonded blocking layer 6 and upper layer 1. In FIG. 9A, the base substrate 10 has been depicted after the first apertures 4 and the central apertures 4c have been produced. FIG. 9B shows the device obtained after the production process, the boundary trench 8 being produced such that its movable portion 7.1 has:

a thick section 7.1a, the thickness of which corresponds to the sum of the thicknesses of the upper layer 1 and the blocking layer 6;

two thin sections 7.1b, the thickness of which is that of the blocking layer 6, each of these sections extending between the thick section 7.1a and the fixed portion 7.2 of the electromechanical device.

Each of the thins sections lies 7.1b above a central aperture 4c produced beforehand in the substrate 10.

The thick section 7.1*a* may then play the role of a seismic mass the movement of which is detected by piezoresistive strain gauges formed on the thin sections 7.1*b*. This type of hybrid structure, combining a MEMS microstructure (the seismic mass 7.1*a*) and nanostructures (the thin sections 7.1*b*) is called a M&NEMS. In this type of structure, it is preferable for each thin section to extend in a direction perpendicular to the longitudinal axis Δ along which the thick section 7.1*a* extends, this longitudinal axis extending between the junction where said thick section 7.1*a* meets the fixed section 7.2, and the end of the thick section 7.1. Preferably, each thin section 7.1*b* is placed closer to said junction than the end of the thick section. These advantageous features allow the movement of the thick portion 7.1*a* to be detected with better sensitivity.

The versatility of the process allows various forms of such hybrid electromechanical devices, combining micro and nanostructures, to be envisaged. By microstructure, what is meant is a structure the smallest dimension of which is comprised between 1 μm and 500 μm. The term nanostructure designates a structure the smallest dimension of which is smaller than 1 μm.

Figure 10A:
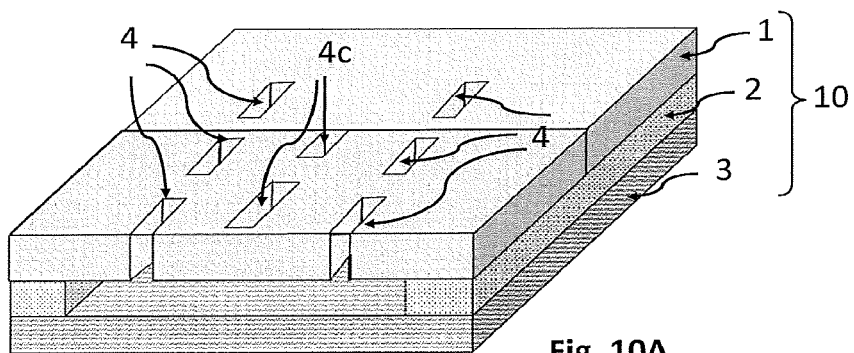
FIGS. 10A and 10B illustrate the main steps of the production of another electromechanical device according to the second embodiment, as do FIGS. 10C and 10D.
Figure 10B:
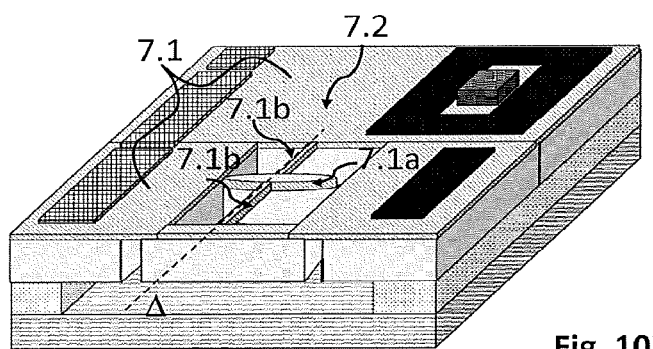

FIGS. 10A and 10B for example show a process for producing an electromechanical device the movable portion 7.1 includes two thin sections 7.1*b* extending along the same longitudinal axis A. Each thin section extends between the fixed portion 7.2 of the device and a microstructure 7.1*a* forming a thick section of the movable portion 7.1, which is disc-shaped. This microstructure may play the role of a seismic mass, with a view to producing an accelerometer.

FIG. 10A shows the base substrate after the first apertures 4 and two central apertures have been formed. FIG. 10B shows the electromechanical device obtained at the end of the production process, the thin sections lying above central apertures 4*c* produced beforehand in the substrate 10.

Figure 10C:
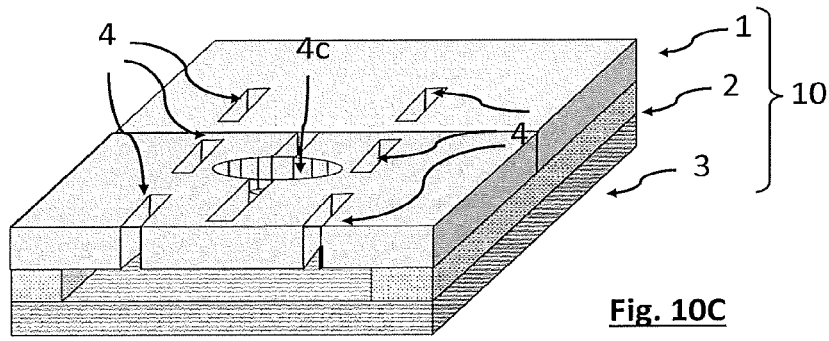
Figure 10D:
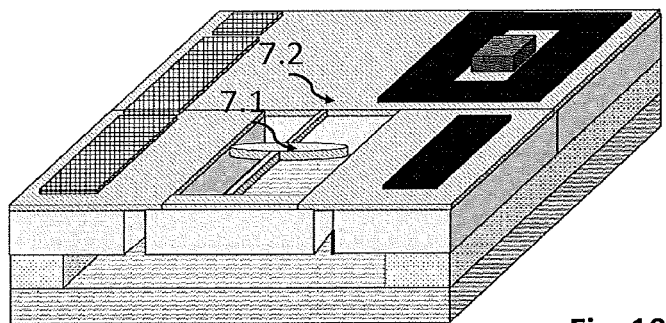

FIGS. 10C and 10D illustrate an example of production of a movable portion 7.1 of the nanostructure type, the thickness of which is typically smaller than 500 nm, for example 100 nm, the movable portion including two beam-shaped sections, each beam connecting the fixed portion 7.2 of the device to a disc-shaped central section of the movable portion 7.1. It could also be ring-shaped. FIG. 10C shows the base substrate after the first apertures 4 and a central aperture 4*c* of complex shape, composed of a well from which two trenches protrude, have been formed. FIG. 10D shows the device obtained at the end of the production process, the thin sections lying above the aforementioned central aperture.

Figure 11:
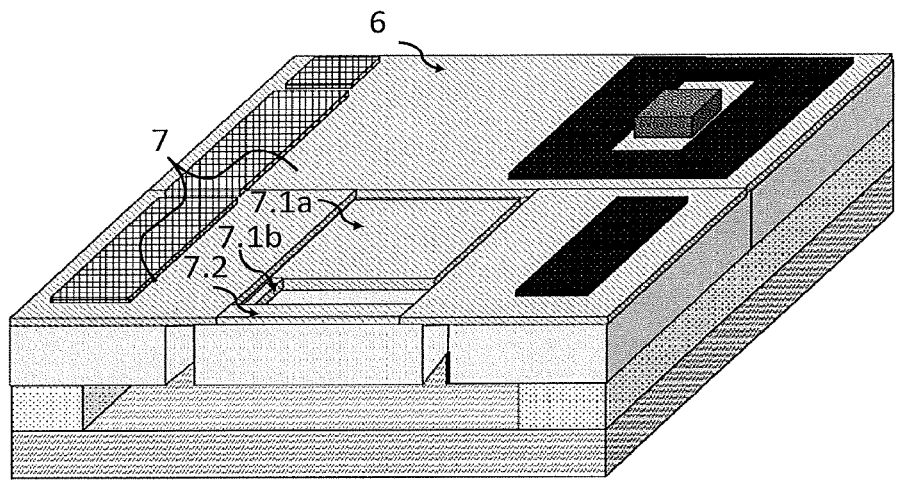
FIG. 11 shows another electromechanical device produced according to the second embodiment.

This shows that the process is able to form suspended nanostructures of complex shapes, without risk of stiction. Another example is given with reference to FIG. 11, which shows an electromechanical device the movable portion 7.1 of which includes a plate-shaped thick section 7.1*a* connected to the fixed portion 7.2 of the device by a thin section 7.1*b*, the latter being beam-shaped. The plate 7.1*a* is held in contact with the fixed portion 7.2 only by the thin beam 7.1*b*. The plate 7.1*a* may have any shape; for example it may be polygonal or circular. Just like the devices shown in FIGS. 10A to 10D, the thin portion 7.1*b* consists solely of the blocking layer 6, whereas the thick portion 7.1*a* consists of the bonded blocking layer 6 and upper layer 1. In this example, the thin section 7.1*b* is a NEMS structure forming a beam via which the MEMS plate 7.1*a* is suspended.

Figure 12:
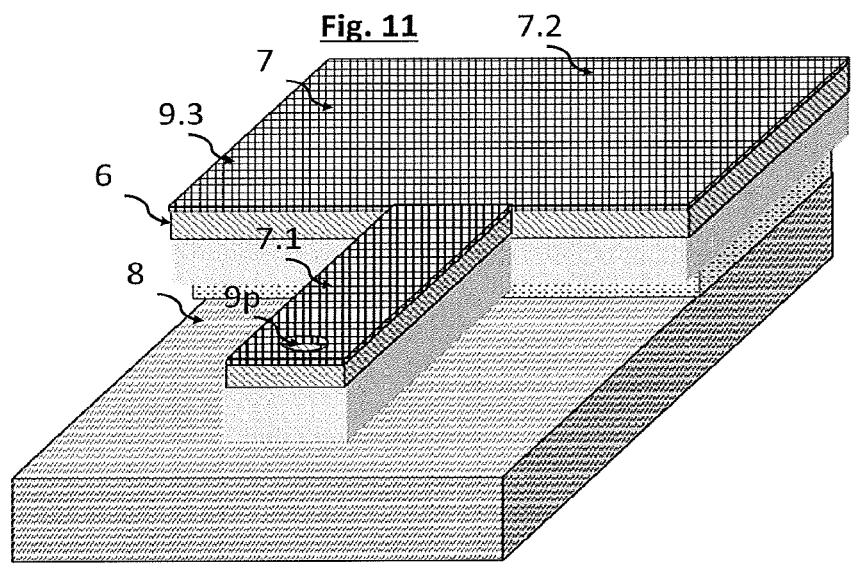
FIG. 12 shows an electromechanical device obtained according to one variant, applicable to all the embodiments.
Figures 14A, 14B:
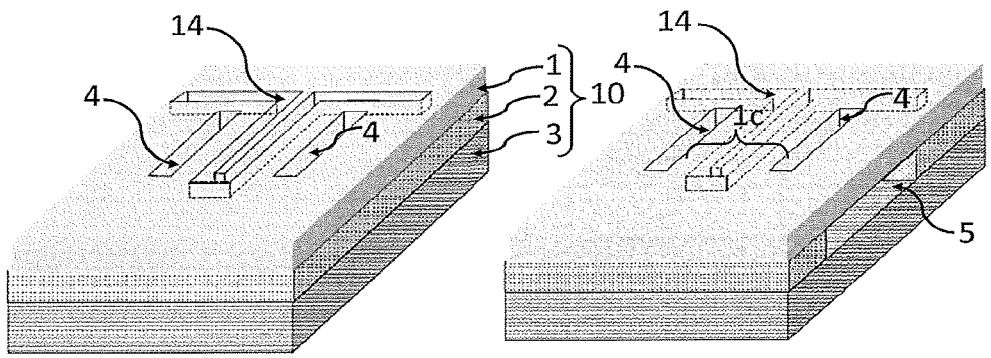
FIGS. 14A to 14E illustrate the main steps of the production of an electromechanical device according to the third embodiment.
Figures 14C, 14D:
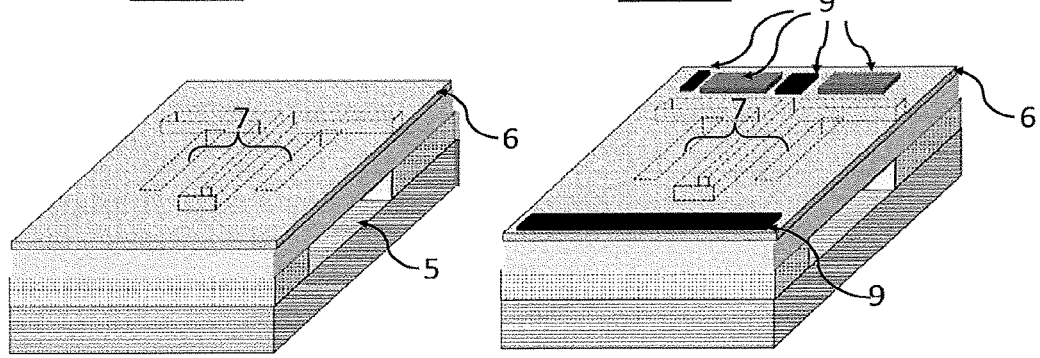
Figure 14E:
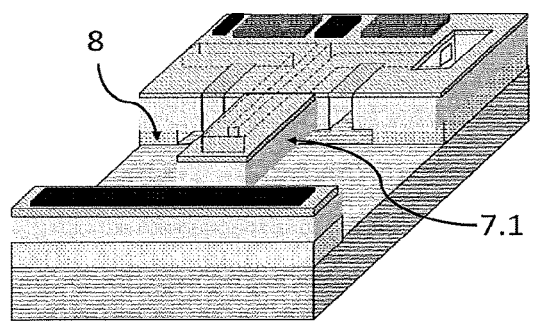

As indicated above, one of the advantages of the process is that it is possible to form a functional architecture including one or more functional elements 9 on the surface of the blocking layer 6, after a portion of the sacrificial layer 2 has been removed in the step of pre-releasing the suspended microstructure 7. This formation of functional elements was referred to above by the term post-processing. The fact that the blocking layer 6 closes the first apertures 4 allows conventional microtechnology-fabrication steps to be used. The electromechanical device depicted in FIG. 12 was obtained by applying a layer 9.3 with hydrophobic properties to the blocking layer 6 prior to the formation of the trench 8 defining the movable portion 7.1 of the device. In this example, the hydrophobic layer 9.3 is applied to the suspended microstructure 7 of the blocking layer, with the exception of a point-like zone 9*p* occupying, once the trench 8 has been formed, one end of the movable portion 7.1 of the device, this movable portion taking the form of a beam. This end is then propitious to the formation of a drop of a liquid to be analysed on the end of this movable portion 7.1. The point-like zone 9*p* may also be functionalized so as to selectively capture certain analytes. For example, the functionalization may be the deposition of a layer of antibodies. Those skilled in the art will understand that this post-processing step may also allow more complex functional architectures to be produced; for example electrical and/or fluidic pathways may be defined, these pathways being configured to allow drops to be moved by electrowetting or by dielectrophoresis, according to known digital-microfluidic principles. As described above, means for detecting the movement of the movable portion 7.1 may also form part of this functional architecture: it may be a question of electrodes for detecting such a movement via a capacitive effect, of zones implanted into the movable portion 7.1 so as to detect deformation of the movable portion 7.1 via a piezoresistive effect, etc. The functional architecture may extend over various portions of the blocking layer 6, these portions being intended to subsequently form the fixed portion 7.2 or the movable portion 7.1 of the electromechanical device.

FIGS. 13A to 13I show one embodiment allowing a movable portion 7.1 to be produced enclosing a fluidic channel 14 that is hollow, so as to be able to be passed through by a fluid. According to this embodiment, prior to the step of pre-releasing the suspended microstructure 7, a fluidic channel 14 that is intended to form part of said suspended microstructure (see FIG. 13A and FIG. 13B) is formed. Its depth is smaller than the depth of the upper layer 1, such that it does not open onto the intermediate layer 2. The fluidic channel 14 may then extend along the upper layer and in particular within the interior of the perimeter of the suspended microstructure. FIG. 13C shows a view from above of the base substrate 10 after this fluidic channel 14 has been formed. The cross section of the fluidic channel, in a plane perpendicular to the plane of the substrate, has a largest dimension smaller than 20 μm, or even than 500 nm or 200 nm. The dimensions $e_1$, $e_2$, $e_3$, $e_4$ and $e_5$ shown in FIG. 13D are for example equal to 400 nm, 400 nm, 200 nm, 200 nm and 200 nm, respectively. This fluidic channel 14 may be produced by dry etching, for example by reactive ion etching (RIE), or by wet etching. It may be formed before, after or simultaneously with the step of forming the first apertures 4. This step may not be limited to the formation of a single channel, and may result in the formation of a microfluidic network 14 in the upper layer 1, this network being composed of a plurality of channels located in the layer 1.

FIG. 13D shows the step of pre-releasing the central portion 1*c*, prior to the deposition of the blocking layer 2, by removing the intermediate layer 2 lying between the first apertures 4, this forming a cavity 5 under the central portion 1*c*. FIGS. 13E, 13F and 13G illustrate the bonding of the blocking layer 6 as described with reference to FIGS. 3G, 3H and 3I, respectively. At the end of this bonding step, a suspended microstructure 7, formed by the bonded central portion 1c and blocking layer 6, is obtained, between the first apertures 4. This blocking layer covers the first apertures 4, and the fluidic channel 14. Thus, the blocking layer 6 closes the fluidic channel 14. FIG. 13H shows the post-processing step consisting in depositing functional elements 9 on the surface of the blocking layer 6. FIG. 13I illustrates the step of forming a trench 8 defining a movable portion 7.1 of the device, in the suspended microstructure 7.

This embodiment allows an electromechanical device including a suspended nano-channel or micro-channel to be formed, this type of device commonly being called, depending on its dimensions, a suspended micro-channel resonator (SMR) or suspended nano-channel resonator (SNR). These devices have a seal-tight channel of micron-sized (or nanoscale) dimensions integrated into their movable portion 7.1, allowing a fluid, generally a liquid, to flow even when the device is placed in free air or in a gaseous environment or under vacuum.

FIGS. 14A to 14E are three-dimensional views showing an example of an electromechanical device obtained by applying the embodiment described with reference to FIGS. 13A to 13I. Five steps of the process have been shown:
forming first apertures 4 and the fluidic channel 14: see FIG. 14A;
pre-releasing the central portion 1c: see FIG. 14B;
bonding the blocking layer 6 and the upper portion 1: see FIG. 14C;
post-processing, with production of a functional architecture 9 on the surface of the blocking layer 6 after the latter has been applied to the upper layer 1: see FIG. 14D; and
forming a boundary trench 8 defining a movable portion 7.1 of the device: see FIG. 14E.

Figure 15:
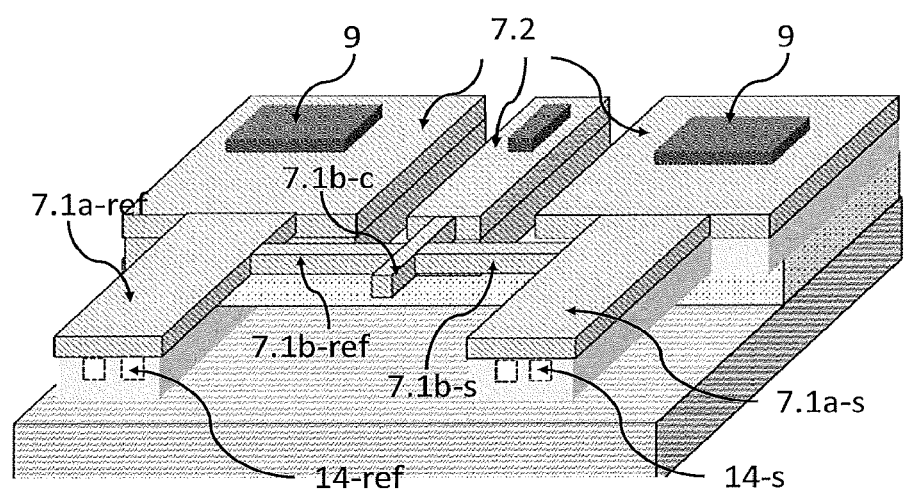
FIG. 15 shows an electromechanical device obtained via a combination of the various embodiments.

The embodiments described above are combinable. This allows an electromechanical device such as that shown in FIG. 15 to be produced, this device including:
a reference thick movable portion 7.1a-ref, in which is located a reference fluidic channel 14-ref through which a reference fluid is intended to pass;
an analysis thick movable portion 7.1a-s, in which is located an analysis fluidic channel 14s through which a sample to be analysed is intended to pass;
a reference thin movable portion 7.1b-ref, in which is located a strain gauge that allows the deformation of this thin movable portion, under the effect of the flow of the reference fluid flowing through the reference thick movable portion 7.1-ref, to be measured;
an analysis thin movable portion 7.1b-s, in which is located a strain gauge that allows the deformation of this thin movable portion, under the effect of the flow of the sample flowing through the analysis thick movable portion 7.1a-s, to be measured;
a thin central beam 7.1b-c, the reference thin movable portion 7.1b-ref lying between said central beam and the reference thick movable portion 7.1a-ref, the analysis thin movable portion 7.1b-s lying between the central beam and the analysis thick movable portion 7.1a-s; and
a fixed portion 7.2 including functional elements 9.

Such a device allows, via comparison of the deformations of the reference and analysis movable portions, a differential measurement to be carried out, thereby allowing a variation in the mass of the sample with respect to the reference fluid to be sensed with precision.

Whatever the embodiment, the process may include a final step of applying a protective substrate, for example made of glass, to the blocking layer 6, so as to form a protective cap protecting the movable portion 7.1 and the functional elements 9.

As is evidenced by the diversity of the nonlimiting examples shown in support of the description, the invention allows electromechanical devices of different forms to be produced. It is a question of a wafer-scale processing, allowing a plurality of devices of identical configuration to be produced on the same substrate.

The invention may be used to fabricate electromechanical devices in a plurality of technological fields, for example movement sensors, gas sensors, and detectors for biological detection, medical detection, environmental detection, detection in the food-processing industry or indeed in the chemical industry, this list not being exhaustive.

The invention claimed is:

1. A Method for producing an electromechanical device from a substrate, called the base substrate, the base substrate comprising an intermediate layer placed between a lower layer and an upper layer, each layer lying parallel to a plane, called the plane of the substrate, the process comprising the following steps:
   a) etching the upper layer so as to form first apertures, transversely to the plane of the substrate, the first apertures extending through the upper layer to the intermediate layer;
   b) removing a portion of the intermediate layer lying between the first apertures, so as to form an empty cavity in the intermediate layer, said empty cavity lying, in the plane of the substrate, between the first apertures, and below the upper layer;
   c) forming a blocking layer on the upper layer, the blocking layer covering the first apertures formed in step a), the blocking layer and the upper layer forming a suspended microstructure lying above the cavity formed in step b), between the first apertures;
   d) producing a boundary trench in the suspended microstructure formed in step c), the boundary trench opening onto the cavity formed in step b), the boundary trench separating the suspended microstructure into a fixed portion and a movable portion, the movable portion being able to deform and overhanging the cavity, the movable portion forming a movable member of the electromechanical device.

2. The method of claim 1, including:
   prior to step c), forming at least one central aperture, through the upper layer, each central aperture lying, in the plane of the substrate, between at least two first apertures, such that, prior to step c), the central aperture opens onto the cavity;
   in step c), covering the central aperture with the blocking layer;
   in step d), producing a trench around a portion of the blocking layer covering the central aperture, the portion of the blocking layer then forming the movable portion of the electromechanical device.

3. The method of claim 1, including, prior to step c), and preferably prior to step b), forming a fluidic channel in the upper layer, such that following step d), the fluidic channel lies in the movable portion.

4. The method of claim 1, including, between step c) and step d), forming functional elements on the blocking layer, the functional elements having:
   an electrical connection function;
   or a fluidic function in that they define a fluidic channel in said upper layer;
   or a function of detection of a mechanical deformation.

5. The method of claim 1, wherein step d) is carried out by dry etching.

6. The method of claim 1, wherein the upper layer includes or is formed by a conductor, in particular single-crystal silicon.

7. The method of claim 1, wherein the intermediate layer is formed by a dielectric, in particular silicon oxide.

8. The method of claim 1, wherein the lower layer is formed by a conductor, in particular single-crystal silicon.

9. The method of claim 1, wherein the blocking layer is or comprises at least one of the following materials:
monocrystalline silicon, polysilicon, germanium, gallium arsenide;
or a dielectric material, in particular chosen from silicon oxide, silicon nitride, a polymer, silicon oxycarbide, Teflon; or
or a conductor, in particular a metal.

10. The method of claim 1, wherein step c) comprises the following substeps:
ci) applying an auxiliary substrate to the base substrate, the auxiliary substrate including a lower layer, the application of the auxiliary substrate being carried out in such a way that the lower layer of the auxiliary substrate is placed on the upper layer of the base substrate, in contact with the latter;
cii) removing some of the auxiliary substrate, so as to leave all or some of the lower layer of the auxiliary substrate securely fastened to the base substrate in the form of a residual lower layer, the residual lower layer forming the blocking layer.

11. The method of claim 10, wherein substep ci) includes molecular bonding of the lower layer of the auxiliary substrate to the upper layer of the base substrate.

12. The method of claim 10, wherein the auxiliary substrate is unrolled onto the upper layer of the base substrate.

13. The method of claim 10, wherein the auxiliary substrate is a flexible substrate.

14. The method of claim 1, wherein in step c), the blocking layer is formed by chemical vapour deposition, or by sputtering, on the upper layer.

15. The method of claim 1, wherein in step c), the blocking layer is formed by thermal oxidation of the upper layer.

16. The method of claim 1, wherein the thickness of the blocking layer is smaller than 200 μm.

17. The method of claim 1, wherein, following step d), the width of the boundary trench, between the fixed portion and the movable portion of the suspended microstructure, is smaller than 10 μm.

18. An electromechanical device obtained using a method of claim 1.

* * * * *